(12) United States Patent
Honda

(10) Patent No.: US 8,385,129 B2
(45) Date of Patent: Feb. 26, 2013

(54) SEMICONDUCTOR MEMORY DEVICE AND CONTROL METHOD THEREOF

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 13/149,286

(22) Filed: May 31, 2011

(65) Prior Publication Data
US 2011/0292736 A1 Dec. 1, 2011

(30) Foreign Application Priority Data

May 31, 2010 (JP) ................................. 2010-125138

(51) Int. Cl.
G11C 16/26 (2006.01)
(52) U.S. Cl. ............................. 365/185.21; 365/185.22
(58) Field of Classification Search ........................ None
See application file for complete search history.

(56) References Cited

U.S. PATENT DOCUMENTS 5,550,770 A * 8/1996 Kuroda .......................... 365/145
7,539,067 B2 5/2009 Maejima
2006/0245259 A1* 11/2006 Fukuda et al. ............ 365/185.22
2008/0212370 A1* 9/2008 Tokiwa ..................... 365/185.09
2009/0168522 A1* 7/2009 Shibata et al. ............ 365/185.09

FOREIGN PATENT DOCUMENTS

JP 9-251786 9/1997
JP 2007-133995 5/2007

OTHER PUBLICATIONS

U.S. Appl. No. 12/884,878, filed Sep. 17, 2010, Yasuhiko Honda.
U.S. Appl. No. 12/881,688, filed Sep. 14, 2010, Yasuhiko Honda.

* cited by examiner

Primary Examiner — Hoai V Ho
Assistant Examiner — Thang Hoang
(74) Attorney, Agent, or Firm — Oblon, Spivak, McClelland, Maier & Neustadt, L.L.P.

(57) ABSTRACT

According to one embodiment, a semiconductor memory device includes a plurality of memory cells in which data can be rewritable, a plurality of bit lines connected to the plurality of memory cells, and a plurality of sense circuits that are connected to the plurality of bit lines, respectively, sense data written in the memory cells to perform a verify operation with the bit lines charged to first potentials, and charge a bit line, which is connected to a memory cell determined to be defective as a result of the verify operation, to the first potential in the verify operation.

15 Claims, 7 Drawing Sheets

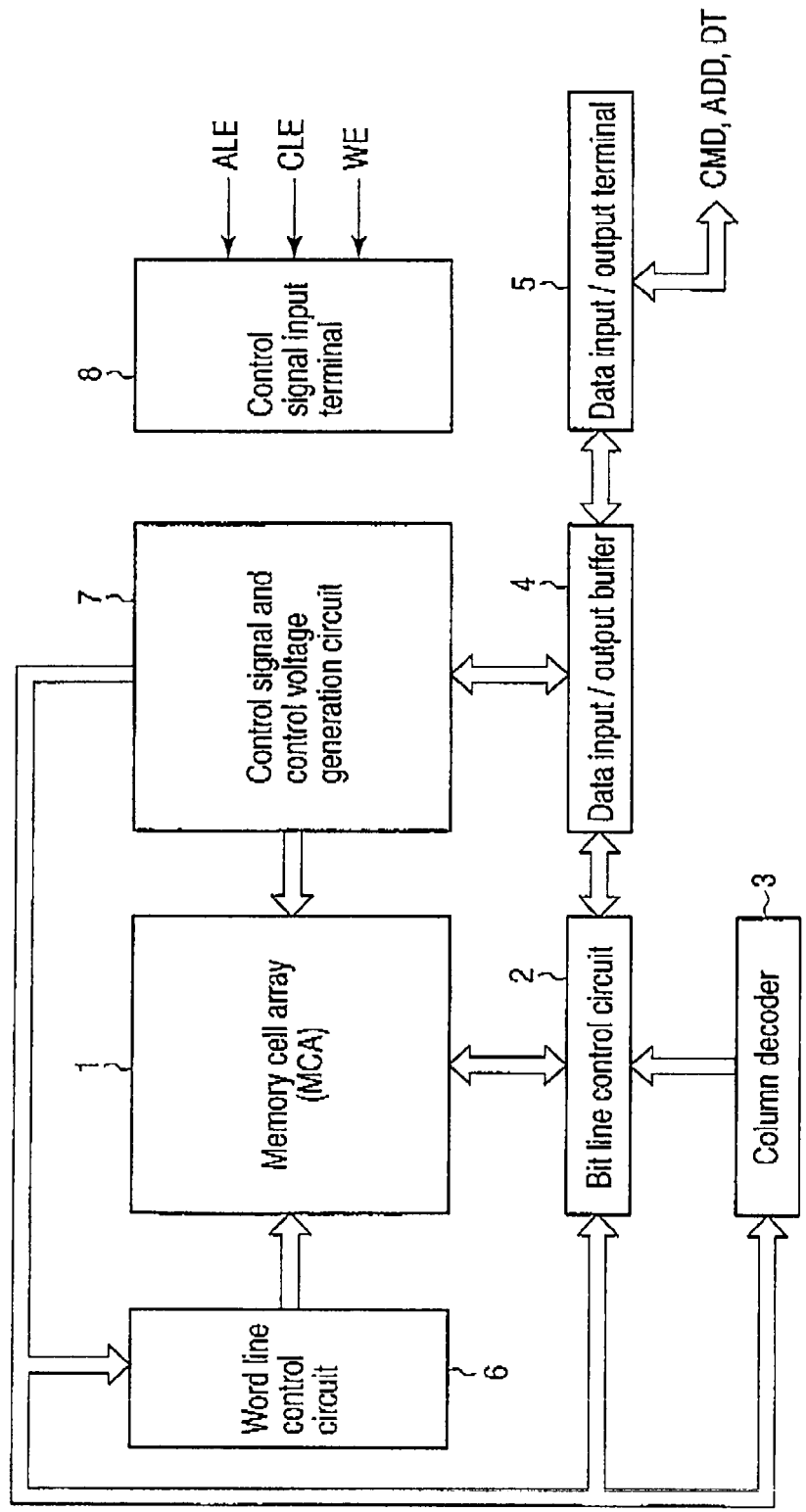
F I G. 1

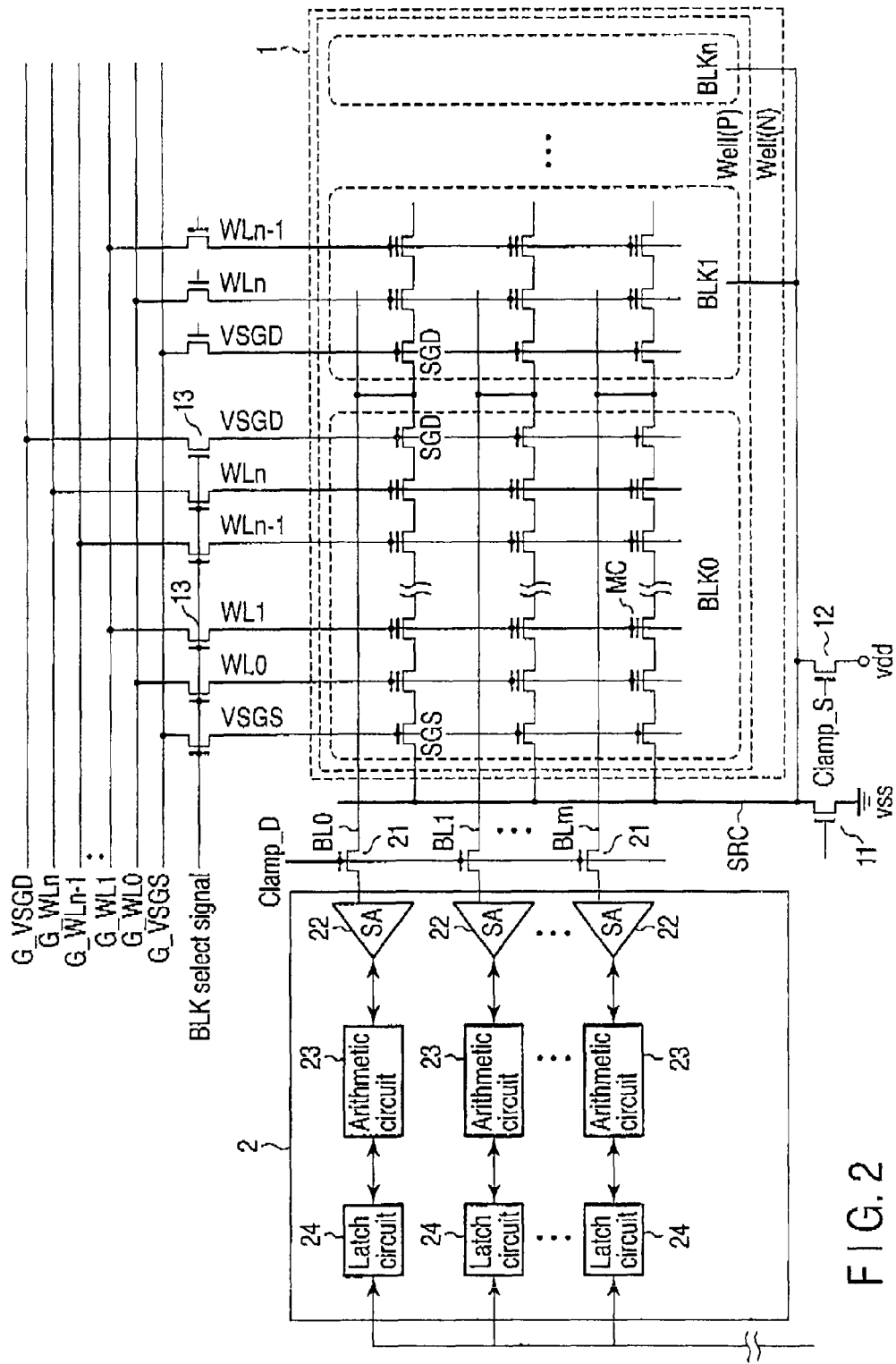
F I G. 2

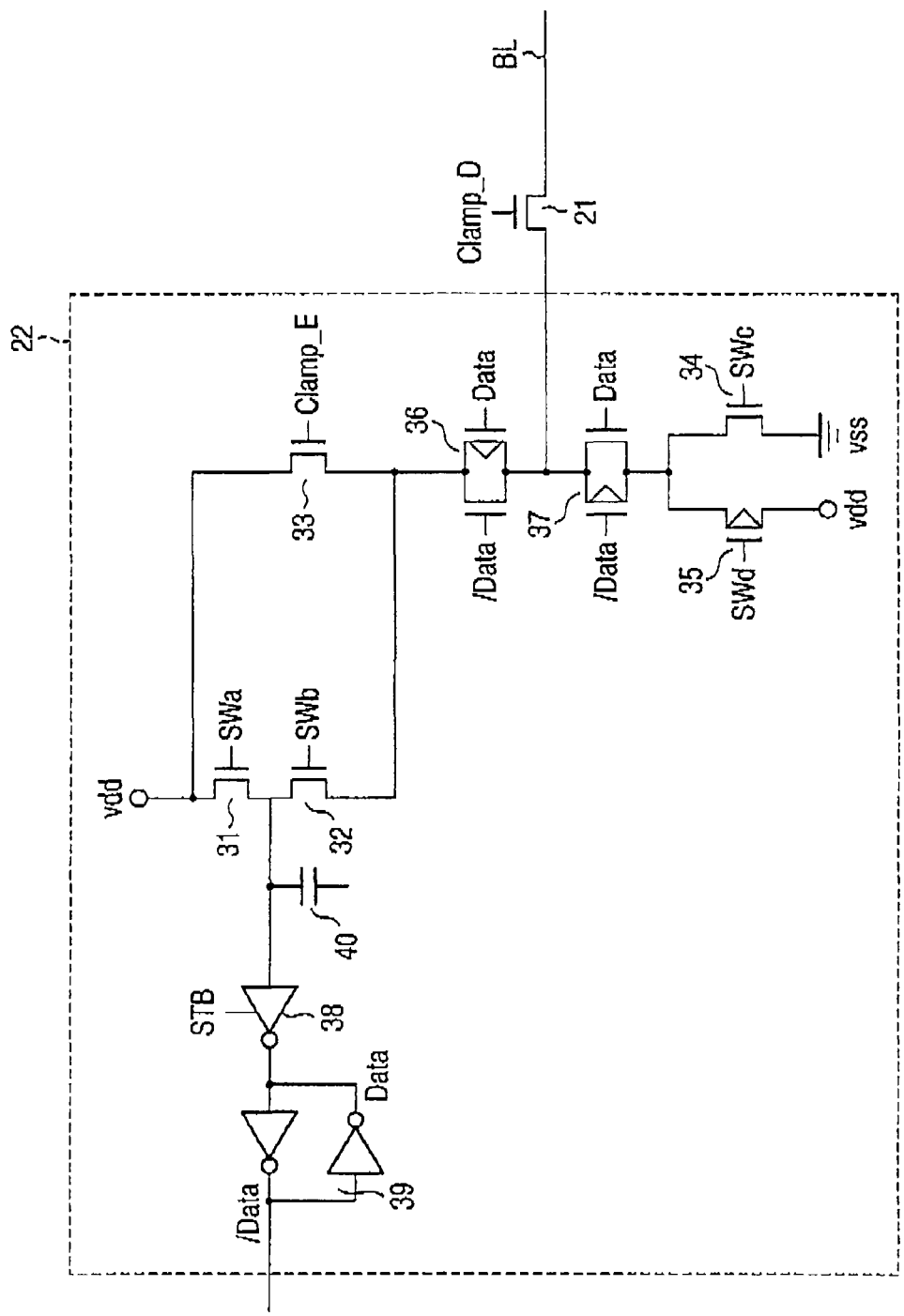
F I G. 3

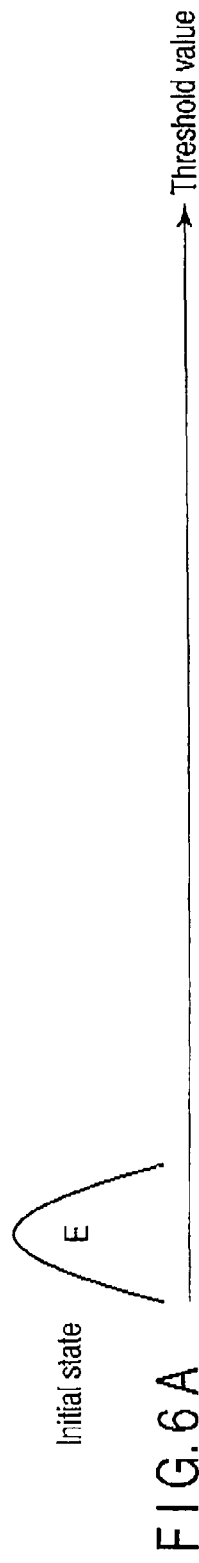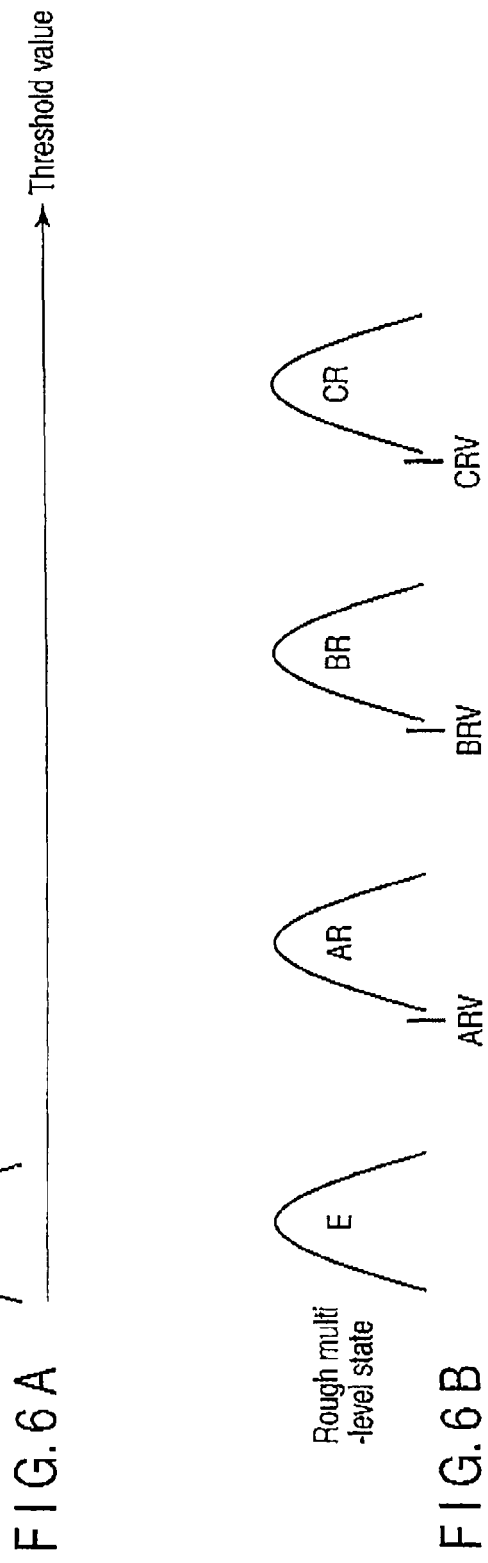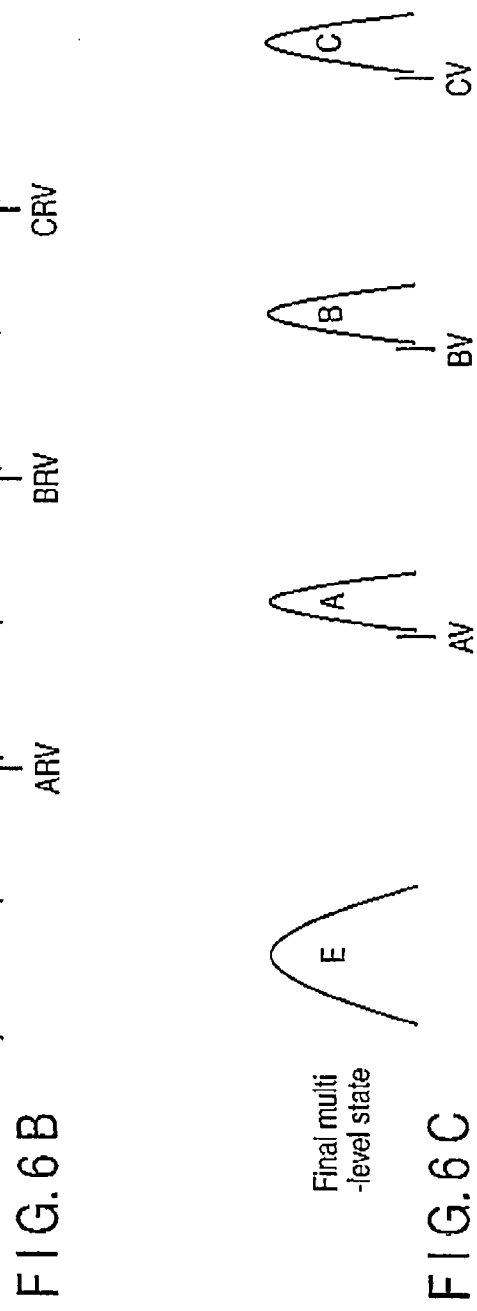
FIG. 6A Initial state
FIG. 6B Rough multi-level state
FIG. 6C Final multi-level state

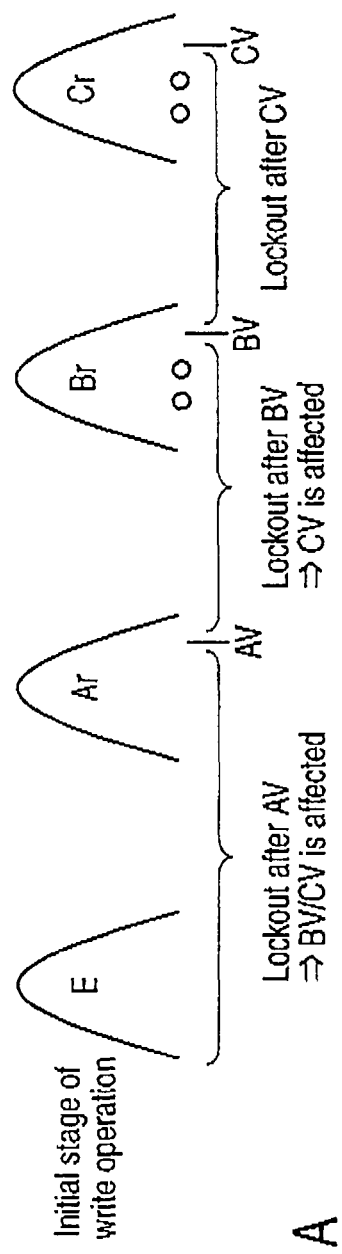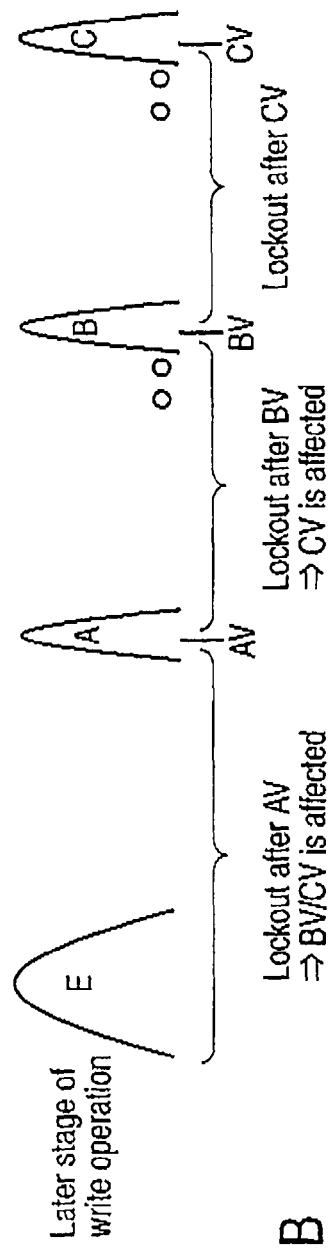
FIG. 7A
FIG. 7B

SEMICONDUCTOR MEMORY DEVICE AND CONTROL METHOD THEREOF

CROSS-REFERENCE TO RELATED APPLICATIONS

This application is based upon and claims the benefit of priority from Japanese Patent Application No. 2010-125138, filed May 31, 2010; the entire contents of which are incorporated herein by reference.

FIELD

Embodiments described herein relate generally to a semiconductor memory device such as an NAND type flash memory and a control method thereof.

BACKGROUND

In an NAND type flash memory, a sense system for reading or verifying data in memory cells while conducting a current through the memory cells is in heavy usage.

BRIEF DESCRIPTION OF THE DRAWINGS

FIG. 1 is a block diagram showing an entire configuration of an NAND type flash memory according to a first embodiment;

FIG. 2 is a circuit diagram showing an example of a configuration of a memory cell array and a bit line control circuit depicted in FIG. 1;

FIG. 3 is a circuit diagram showing an example of a detailed configuration of a sense circuit depicted in FIG. 2;

FIGS. 6A, 6B, and 6C are views showing transition states of a threshold value of a memory cell when writing 4-level (2-bit) data in a second embodiment;

FIGS. 7A and 7B are views showing transition states of a threshold value of a memory cell when writing 4-level (2-bit) data in a third embodiment;

DETAILED DESCRIPTION

Figure 4:
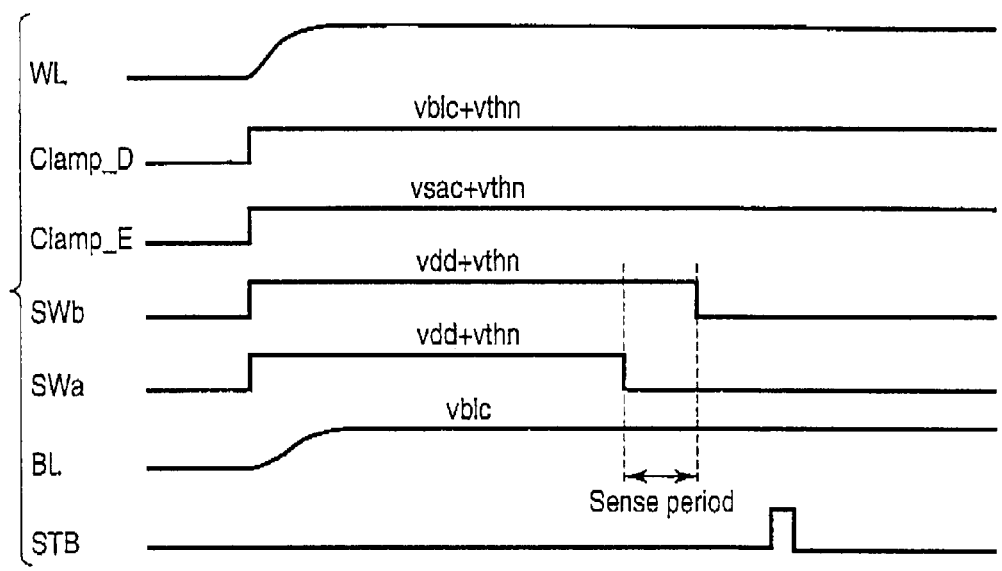
FIG. 4 is a timing chart showing an example of operations of the sense circuit depicted in FIG. 3.

In general, according to one embodiment, a semiconductor memory device comprises: a plurality of memory cells in which data can be rewritable; a plurality of bit lines connected to the plurality of memory cells; and a plurality of sense circuits that are connected to the plurality of bit lines, respectively, sense data written in the memory cells to perform a verify operation with the bit lines charged to first potentials, and charge a bit line, which is connected to a memory cell determined to be defective as a result of the verify operation, to the first potential in the verify operation.

In the above-described sense system, there is a request for a reduction in consumption current. Therefore, at the time of a verify operation on a write level (which will be referred to as PV hereinafter), a memory cell in which a write operation has failed, i.e., in which a threshold value does not reach a verify level and which has a large amount of a memory cell current is determined a non-PV target during the PV until the next write operation is performed. That is, a system that prevents each bit line from being charged (which will be referred to as lockout hereinafter) is adopted.

However, as miniaturization of memory cells advances, a channel potential of the memory cell that has become the non-PV target affects memory cells in an adjacent NAND cell unit. As a result, a memory cell current in the adjacent NAND cell unit is reduced. That is, an effect of making a threshold value of the memory cell look high becomes remarkable (this effect will be referred to as an adjacent NAND channel effect hereinafter). As a result, in the memory cell in the NAND cell unit adjacent to the memory cell which is the non-PV target, the threshold value has not actually reached the highest value (an insufficient write operation), but the threshold value seems high due to the adjacent NAND channel effect, and a problem that the PV erroneously has a successful result. When reading data from the memory cell that erroneously has a successful PV result, since a read operation is carried out without locking out all the memory cells, the adjacent NAND channel effect cannot be provided. Therefore, the threshold value is lowered to an original value, and hence a read defect occurs.

Embodiments will now be described hereinafter with reference to the accompanying drawings.

First Embodiment

FIG. 1 is a block diagram showing an entire configuration of an NAND type flash memory according to a first embodiment. A memory cell array (MCA) 1 includes a plurality of bit lines, a plurality of word lines, and a common source line, and has a configuration that a plurality of memory cells which are formed of, e.g., EEPROM cells and in which data can be electrically rewritten are arranged in a matrix form. To the memory cell array 1 are connected a bit line control circuit 2 configured to control the bit lines and a word line control circuit 6.

The bit line control circuit 2 has sense circuits that read out data in the memory cells in the memory cell array 1 through the bit lines, detect states of the memory cells in the memory cell array 1 through the bit lines, and apply a write control voltage to the memory cells in the memory cell array 1 through the bit lines to write data into the memory cells, latch circuits that store data sensed by the sense circuits or write data, and others. To the bit line control circuit 2 are connected a column decoder 3 and a data input/output buffer 4. The latch circuit in the bit line control circuit 2 is selected by the column decoder 3. Data in the memory cell that has been sensed by the sense circuit and stored in the latch circuit is output to the outside from a data input/output terminal 5 through the data input/output buffer 4.

Further, write data input to the data input/output terminal 5 from the outside is input to the latch circuit selected by the column decoder 3 through the data input/output buffer 4.

A word line control circuit 6 selects a word line in the memory cell array 1 and applies a voltage required for a read, write, or erase operation to the selected word line.

The memory cell array 1, the bit line control circuit 2, the column decoder 3, the data input/output buffer 4, and the word line control circuit 6 are connected to a control signal and control voltage generation circuit 7, and they are controlled by this control signal and control voltage generation circuit 7. The control signal and control voltage generation circuit 7 is connected to a control signal input terminal 8, and it is controlled by control signals ALE (address latch enable), CLE (command latch enable), and WE (write enable) input from the outside through the control signal input terminal 8.

The bit line control circuit 2, the column decoder 3, the word line control circuit 6, and the control signal and control voltage generation circuit 7 constitute a write circuit and a read circuit.

FIG. 2 shows an example of configurations of the memory cell array 1 and the bit line control circuit 2 depicted in FIG. 1. A plurality of NAND cells are arranged in the memory cell array 1. Each NAND cell is formed of memory cell MCs consisting of a plurality of EEPROMs connected in series, a first select gate SGS, and a second select gate SGD. Here, each memory cell MC stores multi-level data, i.e., 4-level (2-bit) data. One end of a source and a drain of the first select gate SGS is connected to a common source line SRC, and one end of the second select gate SGD is connected to a bit line BLi (i=0, 1, . . . , m). An N-channel MOS transistor 11 configured to set the common source line SRC to a ground potential vss and an N-channel MOS transistor 12 configured to clamp the same to a power supply potential vdd are connected to the common source line SRC.

Select gate electrodes of the plurality of memory cells MC arranged in each row in the memory cell array 1 are connected to a word line WLj (j=0, 1, . . . , n−1, n) in common, gate electrodes of the first select gates SGS are connected to a first select gate line VSGS in common, and gate electrodes of the second select gates SGD are connected to a second select gate line VSGD in common.

As indicated by broken lines, the memory cell array 1 includes a plurality of blocks (BLK0 to BLKn). Each block is constituted of the plurality of NAND cells, and data is erased in, e.g., blocks. The word lines WLj, the first select gate lines VSGS, and the second select gate line VSGD are connected to global word lines G_WLj, a global first select gate line G_VSGS, and a global second select gate line G_VSGD through block select N-channel MOS transistors 13 controlled in common by a block select signal (a BLK select signal), respectively. That is, a block is selected based on the block select signal, and select signals are supplied to the word lines WLj, the first select gate line VSGS, and the second select gate line VSGD in the selected block from the global word lines G_WLj, the global first select gate line G_VSGS, and the global second select gate line G_VSGD.

Bit line clamp N-channel MOS transistors 21 are provided between the bit lines BLm of the memory cell array 1 and the bit line control circuit 2. Sense circuits (SA) 22, arithmetic circuits 23, and latch circuits 24 are provided in the bit line control circuit 2. The sense circuit 22 reads out data in the memory cells in the memory cell array 1 through the bit lines BLm, senses states of the memory cells in the memory cell array 1 through the bit lines BLm, and applies a write control voltage to the memory cells in the memory cell array 1 through the bit lines BLm to write data into the memory cells. The latch circuit 24 stores write data supplied through the data input/output buffer 4. The arithmetic circuit 23 controls whether a write operation is to be performed by the corresponding sense circuit 22 in accordance with each bit line based on the write data stored in the latch circuit 24 at the time of writing. Moreover, the arithmetic circuit 23 judges whether a verify operation has been successful upon receiving data sensed by the sense circuit 22 at the time of the verify operation after the write operation, and it clears data in the corresponding latch circuit 24 to an initial state when the verify operation has been determined to be successful.

FIG. 3 shows an example of a detailed circuit configuration of the sense circuit 22 depicted in FIG. 2. In FIG. 3, the sense circuit 22 has a plurality of N-channel MOS transistors (the N-channel MOS transistor will be referred to as NMOS hereinafter) 31 to 34, a P-channel MOS transistor (the P-channel MOS transistor will be referred to as PMOS hereinafter) 35, a plurality of CMOS switches 36 and 37 formed of CMOS transfer gates, a clocked inverter 38, a latch circuit 39 formed of two inverters, and a capacitor 40.

One end of a source and a drain of the NMOS 31 is connected to a supply node for the power supply voltage vdd, and the other end of the same is connected to one end of the capacitor 40, an input end of the clocked inverter 38, and one end of a source and a drain of the NMOS 32. A control signal SWa is supplied to a gate electrode of the NMOS 31, and a control signal SWb is supplied to a gate electrode of the NMOS 32. A clock signal CLK is supplied to the other end of the capacitor 40. An operation of the clocked inverter 38 is controlled by a strobe signal STB, and an output end of the clocked inverter 38 is connected to the latch circuit 39. The latch circuit 39 latches sensed data and also latches write data supplied through the arithmetic circuit 23 in FIG. 2.

One end of a source and a drain of the NMOS 33 is connected to the supply node of the power supply voltage vdd, and the other end of the same is connected to the other end of the source and the drain of the NMOS 31. A clamp control signal Clamp_E is supplied to a gate electrode of the NMOS 33. Additionally, one end of the CMOS switch 36 is connected to the other end common connection node of the source and the drain of each of the NMOS 31 and 33. This CMOS switch 36 is controlled to be switched based on complementary data Data and /Data latched by the latch circuit 39, and the other end of this CMOS switch 36 is connected to the corresponding bit line BL through a bit line clamp NMOS 21. Further, the other end of the CMOS switch 36 is connected to one end of the CMOS switch 37. This CMOS switch 37 is controlled to be switched in a complementary manner with the CMOS switch 36 based on the complementary data Data and /Data latched by the latch circuit 39. For example, when the one CMOS switch 36 is turned on based on the complementary data Data and /Data, the other CMOS switch 37 is turned off. One end of a source and a drain of each of the NMOS 34 and the PMOS 35 is connected to the other end of the CMOS switch 37. The other end of the source and the drain of the NMOS 34 is connected to a supply node of the ground potential vss, and the other end of the source and the drain of the PMOS 35 is connected to a supply node of the power supply voltage vdd. A control signal SWc is supplied to a gate electrode of the NMOS 34, and a control signal SWd is supplied to a gate electrode of the PMOS 35.

An operation of the NAND type flash memory having the above-described configuration will now be briefly explained.

[Write Operation]

When writing data into the memory cell, write data previously stored in the latch circuit 24 in FIG. 2 is taken into the latch circuit 39 in the sense circuit 22. When this data is on an L level ("0") indicative of a write operation, the pieces of complementary data Data and /Data latched by the latch circuit 39 are Data=an H level and /Data=the L level. On the other hand, the data is on the H level ("1") indicative of a non-write operation, the pieces of complementary data Data and /Data latched by the latch circuit 39 are Data=the L level and /Data=the H level. Further, when writing data, both control signals SWc and SWd are changed to the H level, and the NMOS 34 is turned on.

Subsequently, the clamp control signals Clamp_E and Clamp_D are changed to the H level. Here, when Data=the H level and /Data=the L level, i.e., when the write data is on the L level indicative of the write operation, the CMOS switch 36 is turned off, the CMOS switch 37 is turned on, and the bit line BL is set to the ground potential vss through the NMOS 21, the CMOS switch 37, and the NMOS 34. In this state, when the word line WL connected to the select gate electrode of the selected memory cell MC is set to have a program voltage Vpgm, the data is written into the selected memory cell.

On the other hand, when the write data is on the H level indicative of the non-write operation, the CMOS switch 36 is turned on, the CMOS switch 37 is turned off, and the bit line BL is set to the power supply voltage vdd through the NMOS 33, the CMOS switch 36, and the NMOS 21. Therefore, when the word line WL connected to the select gate electrode of the selected memory cell MC is set to have the program voltage Vpgm, a channel region of the selected memory cell is boosted to a high potential, and hence the data is not written.

[Read Operation]

When reading out data from the memory cell, the pieces of complementary data Data and /Data previously latched by the latch circuit 39 become Data=the L level and /Data=the H level. Then, the control signals SWa to SWd are changed to the H level, and the clamp control signal Clamp_E and Clamp_D are changed to the H level. As a result, the NMOS 31, 32, 33, and 21 are turned on, and the CMOS switch 36 is turned on, whereby the bit line BL is charged with the power supply voltage vdd to the H level and the node at the one end of the capacitor 40 is also charged with vdd to the H level. Here, if a threshold value of the selected memory cell connected to the bit line BL is higher than a read level, the memory cell is turned off, and the bit line BL is maintained at the H level. Further, a node at the one end of the capacitor 40 is maintained at the H level. On the other hand, if the threshold value of the selected memory cell connected to the bit line BL is lower than the read level, the memory cell is turned on, and the bit line BL is discharged to the L level through the NAND cell including the selected memory cell. Therefore, the node at the one end of the capacitor 40 is discharged to the L level.

Then, the clocked inverter 38 is operated based on a strobe signal STB, and a signal in the node at the one end of the capacitor 40 is transferred to the latch circuit 39. Here, if the signal in the node at the one end of the capacitor 40 is on the H level, an output signal from the clocked inverter 38 is changed to the L level, and the latch circuit 39 latches the pieces of complementary data Data=the L level and /Data=the H level. On the other hand, if the signal in the node at the one end of the capacitor 40 is on the L level, the output signal from the clocked inverter 38 is changed to the H level, and the latch circuit 39 latches the pieces of complementary data Data=the H level and /Data=the L level. Thereafter, the data in the latch circuit 39 is transferred to the latch circuit 24 through the arithmetic circuit 23.

[Write Verify Operation]

When storing 4-level (2-bit) data in the memory cell, a write operation is carried out in such a manner that the memory cell can have any one of four threshold values. Furthermore, at the time of a verify operation after the write operation, data in the memory cell is sensed based on three different types of verify levels. Assuming that the three types of verify levels are, e.g., a level A, a level B, and a level C (A<B<C), a verify operation on the level A, a verify operation on the level B, and a verify operation on the level C are continuously performed after the write operation. The verify levels can be changed by gradually increasing a voltage in the word line connected to the control gate electrode of the selected memory cell.

The write verify operation will now be described with reference to a timing chart of FIG. 4. The timing chart of FIG. 4 shows the verify operation on the level A which is the lowest verify level. Although the write verify operation is substantially equal to the read operation, it is different from the read operation in that the control signals SWc and SWd are changed to the L level. As a result, the NMOS 34 is turned off and the PMOS 35 is turned on in the sense circuit 22.

When verifying write data in the memory cell, the pieces of complementary data Data and /Data previously latched by the latch circuit 39 become Data=the L level and /Data=the H level. Then, the control signals SWa and SWc are changed to the H level, and the clamp control signals Clamp_E and Clamp_D are changed to the H level. As a result, since the NMOS 31, 32, 33, and 21 are turned on and the CMOS switch 36 is turned on, the bit line BL is charged with vdd to the H level (vblc), and the node at the one end of the capacitor 40 is also charged to the H level.

Then, when the control signal SWa is changed to the L level and the NMOS 31 is turned off, a sense period begins. Here, when a threshold value of the selected memory cell connected to the bit line BL is higher than the read level (a voltage in the word line WL), i.e., when the memory cell has a threshold value that has reached a desired value, this memory cell is turned off, and the bit line BL is maintained at the H level. Moreover, the node at the one end of the capacitor 40 is also maintained at the H level. On the other hand, when the threshold value of the selected memory cell connected to the bit line BL is lower than the read level, i.e., when the memory cell has the threshold level that has not been sufficiently increased and has a large amount of memory cell current, the bit line BL is discharged to the L level. Therefore, the node at the one end of the capacitor 40 is discharged to the L level. Then, the control signal SWb is changed to the L level, and the NMOS 32 is turned off, thereby terminating the sense period.

The clocked inverter 38 operates based on the strobe signal STB after end of the sense period, and a signal in the node at the one end of the capacitor 40 is transferred to the latch circuit 39. Here, in case of the memory cell whose threshold value has not been sufficiently increased and which has a large amount of memory cell current, the signal in the node at the one end of the capacitor 40 is on the L level, the output signal from the clocked inverter 38 is changed to the H level, and the latch circuit 39 latches the pieces of complementary data Data=the H level and /Data=the L level.

That is, in regard to the memory cell having an unsuccessful verify result, after end of the sense period, the CMOS switch 37 is turned on, and the bit line BL is charged with the power supply voltage vdd through the PMOS 35, the CMOS switch 37, and the NMOS 21, whereby the high voltage vblc is maintained without lockout. Such a write verify operation is concurrently carried out in the plurality of memory cells in the same block, and the bit line BL connected with the memory cell having an unsuccessful verify result is maintained at the voltage vblc during the verify period of the other memory cells.

Figure 5:
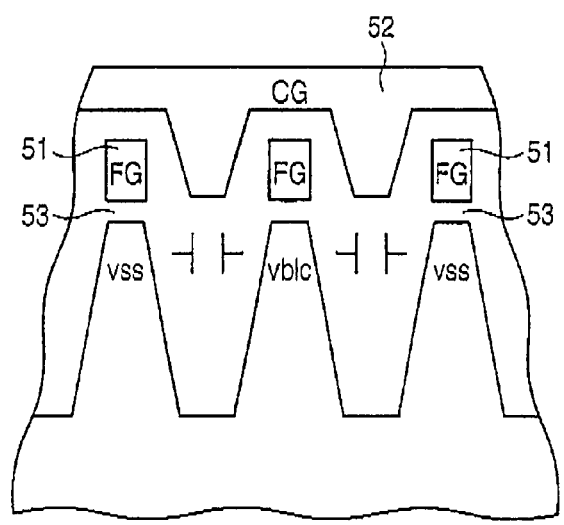
FIG. 5 is a cross-sectional view showing element configurations of a plurality of memory cells that are adjacent to each other in a row direction in one block depicted in FIG. 2.

FIG. 5 is a cross-sectional view showing element configurations of a plurality of memory cells that are adjacent to each other in a row direction in one block depicted in FIG. 2. Reference numeral 51 in FIG. 5 denotes a floating gate electrode (FG) of the memory cell, reference numeral 52 designates a control gate electrode (CG), and reference numeral 53 represents a channel region of the memory cell. In FIG. 5, the verify operation is carried out in the memory cell placed at the center, and the channel region 53 of this memory cell is set to the voltage vblc. Additionally, the two memory cells placed on both sides are determined to have unsuccessful verify results during the verify period and thereby set as non-PV targets, and the channel regions 53 of these memory cells are set to the voltage vss of the locked-out bit line. In such a situation, the channel region 53 of the memory cell placed at the center where the verify operation is continuously performed is affected by the voltages vss in the channel regions 53 of the memory cells as the non-PV targets placed on both the sides, and a threshold value seems high due to the adjacent NAND channel effect even though the threshold value is not sufficiently increased, and hence the PV may possibly erroneously have a successful result.

However, in this embodiment, in regard to the memory cell having the unsuccessful verify result, the bit line BL is set to the high voltage vblc without being locked out. Therefore, in the memory cell placed at the center where the verify operation is continuously carried out, the PV can be prevented from erroneously having a successful result without being affected by the adjacent NAND channel effect.

Second Embodiment

Meanwhile, when writing multi-level data in a memory cell, to avoid interference of threshold fluctuations between memory cells, data is written to provide a state of a threshold value lower than a final threshold value before the data is written to provide the state of the final threshold value.

FIGS. 6A, 6B, and 6C show transition states of a threshold value of the memory cell when writing 4-level (2-bit) data. In an initial state, as shown in FIG. 6A, all memory cells are in an erase state (E) with the lowest threshold values, and they change from multi-level states (AR, BR, CR) with rough threshold values (FIG. 6B) to states of final threshold values (A, B, C) (FIG. 6C) by repeating a write operation. It is to be noted that, in FIGS. 6A, and 6B, ARV, BRV, and CRV denote verify levels used in a verify operation after effecting the write operation to provide the rough multi-level state, and AV, BV, and CV designate verify levels used in the very operation after effecting the write operation to provide the final multi-level state.

It can be considered that the operation of setting the memory cell having an unsuccessful verify result after a data write operation to the high voltage vblc without locking out the bit line BL like the first embodiment is carried out in all continuous verify operations. However, at the time of all verify operations, when the bit line BL connected to the memory cell having the unsuccessful verify result is set to the high voltage vblc, a consumption current may be possibly increased.

Thus, in the second embodiment, with regard to any one of a transient state period where data is written into the memory cell to provide the final threshold state (FIG. 6C) and a transient state period where data is written into the memory cell to provide a previous threshold state lower than the final threshold value (FIG. 6B), a sense circuit 22 performs control in such a manner that a bit line connected to a memory cell having an unsuccessful verify result to a high potential. Effecting such control enables suppressing an increase in consumption current.

Third Embodiment

Meanwhile, as shown in FIGS. 7A and B, the adjacent NAND channel effect occurs mostly in an initial state of the write operation i.e., a state that a majority of memory cells have not had successful PV results yet, and it is reduced in a later state of the write operation. Further, usually, data is prevented from being rewritten into a memory cell that has once had a successful PV result even if this memory cell has an unsuccessful PV result on a later stage, thereby avoiding excessive writing due to a dead band of a sense circuit. Therefore, in the initial state of the write operation, a memory cell that has erroneously had a successful PV result due to the adjacent NAND channel effect is left in a insufficient write state on a subsequent stage. It is to be noted that circles in FIGS. 7A and 3 denote memory cells that have erroneously had the successful PV results due to the adjacent NAND channel effect.

Figure 8:
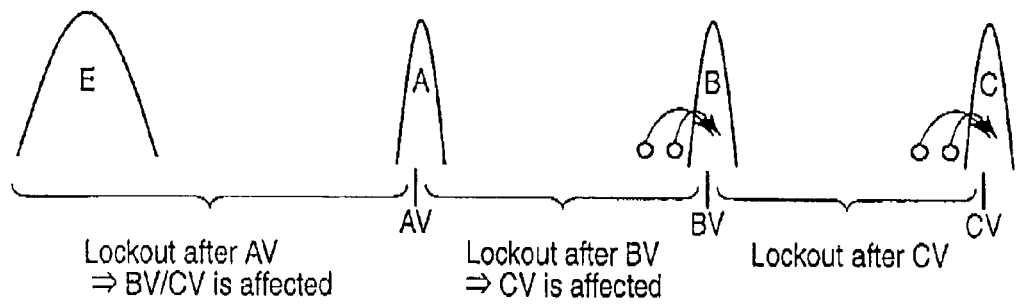
FIG. 8 is a view showing a state of a threshold value of a memory cell after performing a rewrite operation in the third embodiment.

Thus, in this embodiment, an additional rewrite operation is carried out after end of a fundamental write operation. After end of the fundamental write operation, sense data (a verify result) after writing data is stored in a latch circuit 39 in a sense circuit 22. Therefore, before performing the additional write operation, the verify result stored in the latch circuit 39 is reset, write data is stored, and a rewrite operation is performed. Since the write operation has been once terminated, the memory cell is in a write end state, and the adjacent NAND channel effect is weak. Therefore, when the verify operation is performed after the fundamental write operation, a memory cell that has erroneously had a successful result due to an influence of the adjacent NAND channel effect can have a correct PV result, i.e., an unsuccessful PV result in the rewrite operation, and thereafter insufficiency of writing can be avoided as shown in FIG. 8. It is to be noted that, in this embodiment, if the verify operation during a transient state period that the additional write operation is performed is determined to fail, a bit line connected to this memory cell may be set to one of a high potential (vblc) and a low potential (vss) during the verify period.

Fourth Embodiment

Figure 9:
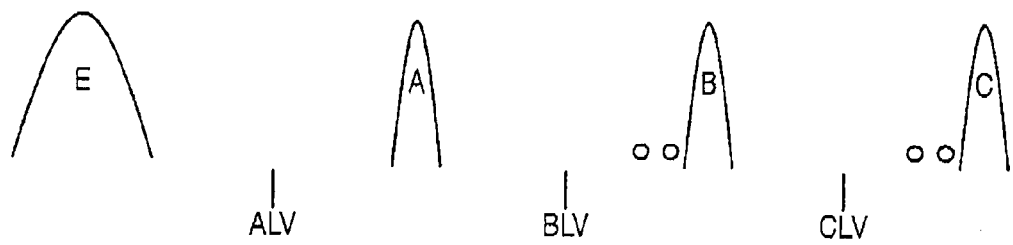
FIG. 9 is a view showing a state of a level PV when reading data before performing a rewrite operation in a fourth embodiment.

In the third embodiment, when a successful result is obtained at the time of a verify operation, data in the latch circuit 24 in the bit line control circuit 2 is cleared to an initial state, i.e., a state of "11", and write data required for an additional rewrite operation is lost. Therefore, the write data must be acquired by any means. In such a case, the write data may be supplied to a data input/output terminal 5 from the outside, and it may be transferred to the latch circuit 24 in the bit line control circuit 2 through a data input/output buffer 4. However, in this embodiment, as shown in FIG. 9, levels PV lower than a regular level PV, e.g., ALV, BLV, and CLV are set in the memory, an operation of reading data from the memory cell after end of the write operation is carried out to restore the write data, a data rewrite operation with respect to the memory cell is carried out by a sense circuit 22 using the restored write operation.

As described above, according to the various embodiments, erroneously having a successful PV result can be avoided without being affected by the adjacent NAND channel effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of data rewritable memory cells;

a plurality of bit lines connected to the plurality of memory cells; and a plurality of sense circuits that are connected to the plurality of bit lines, respectively, sense data written in the memory cells to perform a verify operation in a state that the bit lines are charged to a first potential, and charge the bit line, which is connected to the memory cell determined to have an unsuccessful verify result, to the first potential in the verify operation.

2. The device according to claim 1, wherein, in a write operation, which data is written to provide a state of a first threshold value in the memory cell, the plurality of sense circuits set the bit line, which is connected to the memory cell determined to have the unsuccessful verify result, to the first potential.

3. The device according to claim 1, further comprising a latch circuit configured to store a verify result after the write operation for the memory cell, wherein the verify result stored in the latch circuit is reset, and a rewrite operation for the memory cell is performed through the plurality of sense circuits.

4. The device according to claim 3, wherein the plurality of sense circuits sense written data to perform a verify operation in the data rewrite operation for the memory cell, and set the bit line connected to the memory cell determined to have the unsuccessful verify result to one of the first potential and a second potential lower than the first potential in the verify operation.

5. The device according to claim 3, wherein the plurality of sense circuits read out data in the memory cell to restore write data after the write operation for the memory cell, and use the restored write data to carry out the rewrite operation for the memory cell.

6. The device according to claim 5, wherein the write data is restored at a potential lower than a write verify potential.

7. The device according to claim 1, wherein each of the plurality of sense circuits comprises:

a capacitor having one end electrically connected to the bit line;

a plurality of latch circuits that are electrically connected to the capacitor and configured to latch complementary data in accordance with a level at the one end of the capacitor;

a first switch that has on end electrically connected to the bit line and is configured to be turned on/off in accordance with the complementary data; and a second switch that has a current path having one end connected to the first switch and the other end connected to a power supply unit.

8. The device according to claim 7, wherein the first switch comprises an NMOS transistor and a PMOS transistor.

9. The device according to claim 8, wherein the NMOS transistor and the PMOS transistor are turned on based on the complementary data in the sense circuit associated with the bit line connected to the memory cell determined to have the unsuccessful verify result, and the NMOS transistor and the PMOS transistor are turned off in the sense circuit associated with the bit line connected with the memory cell determined to have a verify result which is not unsuccessful.

10. A control method of a semiconductor memory device comprising:

sensing data written in a memory cell to perform a verify operation, with a bit line being charged to a first potential; and charging the bit line, which is connected with a memory cell determined to have an unsuccessful verify result, to the first potential in the verify operation.

11. The method according to claim 10, further comprising:

writing data into the memory cell to provide a state of a second threshold value lower than a final first threshold value; and writing data to provide a state of the first threshold value from the second threshold value, wherein charging the bit line, which is connected to the memory cell determined to have the unsuccessful verify result, to the first potential is carried out.

12. The method according to claim 10, further comprising:

storing a verify result after writing data into the memory cell; and resetting the stored verify result and performing a data rewrite operation for the memory cell.

13. The method according to claim 12, further comprising:

performing a verify operation in the data rewrite operation for the memory cell; and setting the bit line, which is connected with the memory cell determined to have the unsuccessful verify result, to one of the first potential and a second potential lower than the first potential in the verify operation.

14. The method according to claim 12, further comprising:

reading out data in the memory cell to restore the write data after the data write operation for the memory cell; and performing the data rewrite operation for the memory cell by using the restored write data.

15. The method according to claim 14, wherein the write data is restored by using a potential lower than a write verify potential.

* * * * *